United States Patent
Yamashita et al.

(10) Patent No.: US 7,816,688 B2
(45) Date of Patent: Oct. 19, 2010

(54) SEMICONDUCTOR DEVICE AND PRODUCTION METHOD THEREFOR

(75) Inventors: Kenya Yamashita, Kadoma (JP); Makoto Kitabatake, Nara (JP); Kunimasa Takahashi, Iabaraki (JP); Osamu Kusumoto, Nara (JP); Masao Uchida, Ibaraki (JP); Ryoko Miyanaga, Nara (JP)

(73) Assignee: Panasonic Corporation, Osaka (JP)

( * ) Notice: Subject to any disclaimer, the term of this patent is extended or adjusted under 35 U.S.C. 154(b) by 358 days.

(21) Appl. No.: 10/494,616

(22) PCT Filed: Nov. 27, 2002

(86) PCT No.: PCT/JP02/12396

§ 371 (c)(1),
(2), (4) Date: May 4, 2004

(87) PCT Pub. No.: WO03/047000

PCT Pub. Date: Jun. 5, 2003

(65) Prior Publication Data

US 2005/0017272 A1 Jan. 27, 2005

(30) Foreign Application Priority Data

Nov. 30, 2001 (JP) .............................. 2001-366767

(51) Int. Cl.
*H01L 29/51* (2006.01)

(52) U.S. Cl. ................. 257/77; 257/411; 257/E29.084; 257/E29.014; 257/E29.165

(58) Field of Classification Search .................... 257/77, 257/411, E29.165, E29.084, E29.104, E29.162; 438/216, 287, 954

See application file for complete search history.

(56) References Cited

U.S. PATENT DOCUMENTS 5,972,801 A * 10/1999 Lipkin et al. ................. 438/770

(Continued)

FOREIGN PATENT DOCUMENTS

JP 05-82777 4/1993

(Continued)

OTHER PUBLICATIONS

Hui-feng Li et al., Investigation of nitric oxide and Ar annealed $SiO_2$/SiC Interfaces by x-ray Photoelectron spectroscopy, Journal of Applied Physics, Oct. 15, 1999, pp. 4316 to 4321.

(Continued)

*Primary Examiner*—Lynne A Gurley
*Assistant Examiner*—Andrew O Arena
(74) *Attorney, Agent, or Firm*—McDermott Will & Emery LLP

(57) ABSTRACT

An upper part of a SIC substrate 1 is oxidized at a temperature of 800 to 1400° C., inclusive, in an oxygen atmosphere at $1.4 \times 10^2$ Pa or less, thereby forming a first insulating film 2 which is a thermal oxide film of 20 nm or less in thickness. Thereafter, annealing is performed, and then a first cap layer 3, which is a nitride film of about 5 nm in thickness, is formed thereon by CVD. A second insulating film 4, which is an oxide film of about 130 nm in thickness, is deposited thereon by CVD. A second cap layer 5, which is a nitride film of about 10 nm in thickness, is formed thereon. In this manner, a gate insulating film 6 made of the first insulating film 2 through the second cap layer 5 is formed, thus obtaining a low-loss highly-reliable semiconductor device.

9 Claims, 11 Drawing Sheets

U.S. PATENT DOCUMENTS

| | | | |
|---|---|---|---|
| 6,025,608 A * | 2/2000 | Harris et al. | 257/77 |
| 6,204,203 B1 * | 3/2001 | Narwankar et al. | 438/785 |
| 6,246,076 B1 * | 6/2001 | Lipkin et al. | 257/77 |
| 6,482,704 B1 * | 11/2002 | Amano et al. | 438/285 |
| 6,610,366 B2 * | 8/2003 | Lipkin | 427/378 |
| 6,767,843 B2 * | 7/2004 | Lipkin et al. | 438/758 |
| 2001/0009788 A1 | 7/2001 | Lipkin et al. | |
| 2002/0030191 A1 | 3/2002 | Das et al. | |

FOREIGN PATENT DOCUMENTS

| | | |
|---|---|---|
| JP | 07-169866 | 7/1995 |
| JP | 08-172091 | 7/1996 |
| JP | 10-163338 | 6/1998 |
| JP | 11-67757 | 3/1999 |
| JP | 11-233760 | 8/1999 |
| JP | 11-297712 | 10/1999 |
| JP | 2000-286258 | 10/2000 |
| JP | 2001-210637 | 8/2001 |
| JP | 2001-274157 | 10/2001 |
| JP | 2001-274167 | 10/2001 |
| WO | WO 00/13236 | 3/2000 |

OTHER PUBLICATIONS

Won-ju Cho et al., Study on electron trapping and interface states of various gate dielectric materials in 4H-SiC metal-oxide-semiconductor capacitors, Applied Physics Letters, Sep. 25, 2000, pp. 2054 to 2056.

Philippe Jamet et al., Effects of nitridation in gate oxides grown on 4H-SiC, Journal of Applied Physics, Nov. 15, 2001, pp. 5058 to 5063.

Supplementary European Search Report issued in European Patent Application No. EP 02 78 3666, dated Jan. 21, 2008.

Lipkin, L. A., et al., "Insulator Investigation on SiC for Improved Reliability," IEEE Transactions on Electron Devices, Mar. 1999, pp. 525-532, vol. 46, No. 3, XP-000926942, IEEE.

Lipkin, L. A., et al., "SiC Devices with ONO Stacked Dielectrics," Materials Science Forum, 2000, pp. 1093-1096, vol. 338-342, XP-002951596, Trans Tech Publications, Switzerland.

Japanese Office Action issued in Japanese Patent Application No. 2003-548317, mailed Sep. 1, 2009.

* cited by examiner

FIG. 3

|  | Gas atmosphere | Temperature | Time |
|---|---|---|---|
| ST1 Temperature rise | Silane 6.5 Pa | Temperature rise tu 1300°C | Rapid |
| ST2 Formatino and thermal oxidation of first insulating film 2 | Silane Oxygen $1.4 \times 10^2$ Pa | 1 3 0 0 °C | 10min |
| ST3 Annealing | Nitrogen monoxide $3.9 \times 10^4$ Pa | 1 3 0 0 °C | 30min |
| ST4 Formation of first cap layer 3 | Silane Ammonia $1.4 \times 10^2$ Pa | 9 0 0 °C | 10min |
| ST5 Formation of second insulating film 4 | Dichlorosilane Nitrous oxide $6.5 \times 10$ Pa | 8 0 0 °C | 30min |
| ST6 Annealing process | Nitrogen monoxide $3.9 \times 10^4$ Pa | 8 0 0 °C | 1 hour |
| ST7 Formation of second cap layer 5 | Silane Ammonia $1.4 \times 10^2$ Pa | 8 0 0 °C | 10min |
| ST8 Quenching | Nitrogen | To room temperature | Rapid |

SEMICONDUCTOR DEVICE AND PRODUCTION METHOD THEREFOR

TECHNICAL FIELD

The present invention relates to semiconductor devices including SiC layers and methods for fabricating the devices. More particularly, the present invention relates to an insulated-gate semiconductor device and a method for fabricating the device.

BACKGROUND ART

Silicon carbide has higher dielectric breakdown voltage than other semiconductor materials having wide band gaps. Therefore, silicon carbide is expected to be applied to low-loss power devices in these days.

If an upper part of silicon carbide is thermally oxidized, a good-quality silicon dioxide film is formed on silicon carbide. In view of this, the form of an insulated-gate semiconductor device is considered to be effective in fabricating silicon carbide semiconductor devices driven with high power.

If an MISFET using silicon carbide is used in a low-loss power semiconductor device, the interface state density in an interface region between a gate insulating film and a SiC substrate needs to be lowered for the purpose of reducing a loss by reducing an ON resistance. In the interface region between the gate insulating film and the SiC substrate, a transition layer in which carbon remains is formed, and there is a correlation between the transition layer and the interface state density. It is known that the thickness of the transition layer should be 1 nm or less in order to have an interface state density of $1 \times 10^{12}$ [$cm^{-2}$ $eV^{-1}$] or less according to this correlation (K. Yamashita et al., ICSCRM 2001 Part2 (2001)).

In general, to form a thermal oxide film for a gate insulating film on silicon carbide, a silicon carbide substrate is exposed to an oxidizing gas atmosphere at a temperature of 1000° C. to 1400° C. In this thermal oxidation process, the behavior of carbon, which occupies about a half of the components of silicon carbide in terms of stoichiometry, is largely involved in the formation of the interface region between silicon carbide and the thermal oxide film, and thus affecting on electric characteristics of a device.

PROBLEMS TO BE SOLVED

However, the formation of the thermal oxide film for a gate insulating film on silicon carbide has the following problems.

In a case where a thermal oxide film is formed on silicon carbide, a high-concentration interface state is formed in an interface portion between silicon carbide and the thermal oxide film because of defects existing in the thermal oxide film. For example, in a thermal oxide film formed on a (0001) place of 4H—SiC and having a thickness of 40 nm, it is difficult to keep the interface state density at $5 \times 10^{11}$ [$cm^2$ $eV^{-1}$] or less.

The interface state has a great influence on electron transfer, and seriously lowers the channel conductance of the device.

DISCLOSURE OF INVENTION

An object of the present invention is providing a low-loss semiconductor device with high reliability by taking a means for uniformity in an interface portion between an insulating film and a SiC layer in the semiconductor device including the SiC layer. It is another object of the present invention is providing a method for fabricating the semiconductor device within a time which is industrially preferable.

An inventive semiconductor device includes: a SiC substrate including a source region and a drain region; a gate insulating film formed on part of the SiC substrate; and a gate electrode formed on the gate insulating film, wherein a transition layer with a thickness of 1 nm or less is formed in an interface region between the SiC substrate and the gate insulating film.

In this device, the channel resistance can be reduced, thus allowing the performance of the SiC power device to be fully exploited.

The gate insulating film includes: a first insulating film formed by oxidizing part of the SiC substrate; and a second insulating film deposited over the first insulating film. Then, the thickness of the first insulating film is smaller than that of a conventional thermal oxide film. Accordingly, the uniformity in an interface portion between the SiC substrate and the first insulating film improves, so that the occurrence of interface state can be suppressed. In addition, the formation of the second insulating film allows the gate insulating film to have a thickness necessary as a gate insulating film of a low-loss power semiconductor device.

The first insulating film has a thickness of 0.5 nm to 20 nm, both inclusive. Then, the thickness of the first insulating film is smaller than that of a conventional thermal oxide film. Accordingly, the interface portion between the SiC substrate and the first insulating film is controlled easily.

The first insulating film is formed by thermally oxidizing part of the SiC substrate. Then, an oxide film with good quality is obtained as the first insulating film.

The first insulating film has a nitrogen content of 10.0% or less. Then, the occurrence of defects in the first insulating film is suppressed.

The second insulating film preferably has a thickness of 5 nm to 200 nm, both inclusive.

The second insulating film is preferably made of one of an oxide, a nitride and an oxynitride.

The inventive semiconductor device includes a first cap layer between the first insulating film and the second insulating film. Then, even if heat treatment is performed in the fabrication of the semiconductor device, it is possible to prevent oxygen, for example, from diffusing toward the first insulating film and the SiC substrate.

The first cap layer has a thickness of 0.5 nm to 10 nm, both inclusive. Then, the first cap layer functions as a cap, and in addition, can suppress an influence of defects, which tends to increase when the thickness is too large.

The first cap layer is made of an oxynitride film having an N/(N+O) value of 0.1 to 0.5, both inclusive. Then, it is possible to suppress the occurrence of a stress in the gate insulating film.

The inventive semiconductor device includes a second cap layer made of a nitride film or an oxynitride film having a thickness of 0.5 nm to 10 nm, both inclusive, between the second insulating film and the gate electrode. Then, it is possible to prevent an impurity from diffusing toward the second insulating film, for example, in the formation of the gate electrode. The impurity is a metal in a case where a metal electrode is formed and is boron (B) or phosphorus (P) in a case where a polysilicon electrode is formed.

The gate insulating film is formed by performing dry oxidation on part of the SiC substrate, performing preannealing in an atmosphere containing hydrogen, and then performing annealing in an atmosphere containing molecules including oxygen and molecules including nitrogen. Then, a gate insulating film having a low hydrogen concentration and a high density is obtained. Accordingly, a semiconductor device with high dielectric breakdown voltage and high reliability can be obtained.

The gate insulating film is formed by performing dry oxidation on part of the SiC substrate, performing preannealing in an atmosphere containing halogen, and then performing annealing in an atmosphere containing molecules including oxygen and molecules including nitrogen. Then, a gate insulating film having a low hydrogen concentration and a high density is obtained. Accordingly, a semiconductor device with high dielectric breakdown voltage and high reliability can be obtained.

The semiconductor device may be an inversion-type enhancement-mode transistor.

The semiconductor device may be an accumulation-type enhancement-mode transistor.

A first inventive method for fabricating a semiconductor device includes at least the steps of: a) oxidizing part of a SiC substrate, thereby forming a first insulating film; b) forming a second insulating film over the first insulating film; c) forming a gate electrode over part of the SiC substrate with the first and second insulating films sandwiched therebetween; and d) forming a source region and a drain region in part of the SiC substrate.

With this method, a first insulating film with a thickness smaller than that of a conventional film is formed with good controllability of the interface between the SiC substrate and the first insulating film in the step a), and a second insulating film is formed to have a thickness necessary as a gate insulating film in the step b). Accordingly, it is possible to fabricate a semiconductor device with small amount of interface state at the interface between the SiC substrate and the gate insulating film, with little segregation of, for example, C and with a sufficient thickness.

In the step a), the part of the SiC substrate is preferably thermally oxidized at a temperature of 800° C. to 1400° C., both inclusive, thereby forming the first insulating film.

In the step a), the part of the semiconductor layer is preferably oxidized in an atmosphere having an oxygen partial pressure of $1.4 \times 10^2$ Pa or less, thereby forming the first insulating film. Then, the first insulating film can be formed with excellent controllability even under high temperature.

In the step a), the part of the semiconductor layer is oxidized in an atmosphere containing oxygen and nitrous oxide or in an atmosphere containing oxygen and nitrogen monoxide, thereby forming the first insulating film. Then, an oxynitride film containing a trace amount of nitrogen is formed. Accordingly, a first insulating film with a small amount of defects is obtained.

In the step a), the partial pressure of oxygen is preferably at atmospheric pressure or less and the partial pressure of nitrous oxide or nitrogen monoxide is 10% or less of the partial pressure of oxygen.

In the step a), the SIC substrate is placed in CVD apparatus and an upper part of the SiC substrate is oxidized in an atmosphere containing at least one of oxygen, nitrous oxide and nitrogen monoxide and containing silane at a partial pressure of $1.4 \times 10^2$ Pa or less, thereby forming the first insulating film. Then, an upper part of the SiC substrate is oxidized with silane introduced to supply Si onto the SiC substrate. Accordingly, a thermal oxide film with good quality is formed without oxidizing the upper part of the SiC substrate excessively during the oxidation.

Annealing may be further performed at a temperature of 600° C. to 1400° C., both inclusive, in a nitrogen monoxide atmosphere at a partial pressure of $1.4 \times 10$ Pa to atmospheric pressure, both inclusive, for one hour or more after the step a) has been performed.

The first inventive method further includes the step e) of forming a first cap layer on the first insulating film, after the step a) has been performed, wherein in the step b), the second insulating film is formed on the first cap layer. Then, if heat treatment is performed after the step b), it is possible to prevent oxygen, for example, from diffusing toward the first insulating film and other films.

In the step e), the first cap layer is preferably formed by a CVD process at a temperature of 600° C. to 1000° C., both inclusive, which is lower than or equal to a temperature for forming the first insulating film, in an atmosphere including, at a partial pressure of $1.4 \times 10^2$ Pa or less, a first supply gas containing silane and an ammoniacal gas.

In the step e), the first cap layer may be formed in an atmosphere to which nitrous oxide having a flow rate of 10% or less of that of the first supply gas is further added.

In the step b), the second insulating film may be formed by a CVD process in an atmosphere containing silane and nitrous oxide at a temperature in the range from 600° C. to 1000° C., both inclusive, and less than or equal to the annealing temperature.

Annealing may be performed in an atmosphere containing nitrogen monoxide at a temperature in the range from 600° C. to 1000° C., both inclusive, and less than or equal to a temperature for forming the second insulating film, after the step b) has been performed.

The first inventive method further includes the step f) of forming a second cap layer on the second insulating film, after the step b) has been performed and before the step c) is performed. Then, it is possible to prevent the quality of the insulating film from degrading at its interface during the formation of an electrode. As a result, the reliability of the gate insulating film is improved.

In the step f), the second cap layer may be formed by a CVD process at a temperature of 600° C. to 1000° C., both inclusive, which is lower than or equal to a temperature for forming the second insulating film, in an atmosphere including, at a partial pressure of $1.4 \times 10^2$ Pa or less, a second supply gas containing silane and an ammoniacal gas.

In the step f), the second cap layer may be formed in an atmosphere to which nitrous oxide having a flow rate of 10% or less of that of the second supply gas is further added.

It should be noted that even if the change in the insulating film and semiconductor interface is sufficiently sharp and discontinuous, the band structure in this interface changes continuously and the thickness of the interface is 0.5 nm, i.e., the distance of transition from the nonconduction region to the conduction region in the interface is at least 0.5 nm. Accordingly, the minimum thickness of the first insulating film is 0.5 nm for the purpose of forming a high-quality interface with excellent controllability. The present invention is, of course, not limited to this as long as the change in the interface is not discontinuous and the interface has a width.

A second inventive method for fabricating a semiconductor device includes the steps of: a) oxidizing part of a SiC substrate with a dry oxidation process, thereby forming an insulating film; b) performing annealing on the insulating film in an atmosphere containing molecules including oxygen, after the step a) has been performed; c) forming a gate electrode over part of the SiC substrate with the insulating film sandwiched therebetween; and d) forming a source region and a drain region in part of the SiC substrate.

With this method, an insulating film having a low hydrogen concentration and a high density is obtained in the step a) and a transition layer formed between the insulating film and the SiC substrate is oxidized by oxygen in the step b). Accordingly, the transition layer can be made thin.

In the step a), the insulating film is formed in an atmosphere containing at least one of oxygen, nitrous oxide and nitrogen monoxide. Then, a gate insulating film having high film property can be obtained.

In the step a), the insulating film is preferably formed at a temperature of 1000° C. to 1400° C., both inclusive.

In the step b), the annealing is performed by irradiating an atmosphere containing ozone with UV light. Then, oxygen radicals are generated, so that the transition layer is oxidized effectively.

In the step b), the annealing is further performed in an atmosphere containing molecules including nitrogen. Then, defects included in, for example, the insulating film are filled with nitrogen, so that the thickness of the transition layer can be further reduced.

In the step b), the annealing may be performed in an atmosphere containing ammonia or nitrogen monoxide.

The second inventive method further includes the step e) of performing preannealing on the insulating film, after the step a) has been performed and before the step b) is performed. Then, carbon remaining the transition layer and its vicinity is released therefrom.

In the step e), the preannealing may be performed at a temperature of 700° C. to 1000° C., both inclusive, in an atmosphere containing hydrogen.

In the step e), the preannealing may be performed at a temperature of 900° C. to 1200° C., both inclusive, in an atmosphere containing halogen.

In the step e), the preannealing is performed at a temperature of 1000° C. or less in a gas atmosphere containing dichlorosilane at a pressure of 13.3 Pa or less. Then, carbon can be released effectively.

BRIEF DESCRIPTION OF DRAWINGS

FIG. 3 is a table showing conditions for a process of forming the gate insulating film of the semiconductor device of the first embodiment.

BEST MODE FOR CARRYING OUT THE INVENTION

Embodiment 1

In this embodiment, a case of forming, as a gate insulating film for an MISFET or the like, a first insulating film by thermal oxidation of SIC and a second insulating film by deposition with, for example, a CVD process, will be described.

Consideration of Present Inventors

In general, to use a silicon carbide MISFET for a low-loss power semiconductor device, it is considered to be necessary to form a gate insulating film with a thickness of about 150 nm or more on silicon carbide.

However, carbon remains in an oxide film formed by thermal oxidation on an upper part of silicon carbide and, in particular, a high concentration of carbon remains in a portion of the oxide film near the interface with silicon carbide. Since such remaining carbon is a cause of defects, it is necessary to have a sharp change in composition of a transition layer from the gate insulating film to silicon carbide.

In order to remove carbon remaining in and near the interface portion between silicon carbide and the thermal oxide film for uniformity in the interface portion, it is considered to be sufficient to perform, subsequent to the thermal oxidation process, an oxide film annealing technique (hereinafter, referred to as a POA process) of exposing the substrate to an oxygen atmosphere at such a low temperature that the oxidation does not proceed any more. However, if the thermal oxide film formed on silicon carbide has a thickness of 20 nm or more, it is difficult to perform the POA process sufficiently.

On the other hand, a technique of using an oxide film deposited by a CVD process as a gate insulating film is considered to be another technique for forming an oxide film on silicon carbide. In the oxide film deposited by the CVD process, the composition of the interface portion between the oxide film and silicon carbide changes sharply. In addition, the deposited oxide film can be formed in a short time. Since the thermal oxide film is formed in silicon carbide 1/100 faster than in silicon, the CVD process is industrially necessary in terms of productivity as well. However, in the oxide film deposited by the CVD process, it is difficult to control the interface portion in order to reduce dangling bonds between atoms in the interface portion between silicon carbide and the deposited oxide film. Therefore, it is possible to apply the deposited oxide film to a device.

In view of this, the present inventors invented a method for forming a gate insulating film by thermally oxidizing an upper part of silicon carbide to form a thermal oxide film and then further depositing a CVD oxide film on the thermal oxide film.

Structure of Gate Insulating Film and Example of Application to Device

Hereinafter, a structure of the gate insulating film obtained from the above consideration, and an example of application of the gate insulating film to an inversion-type enhancement-mode insulated-gate semiconductor device will be described.

Figure 1:
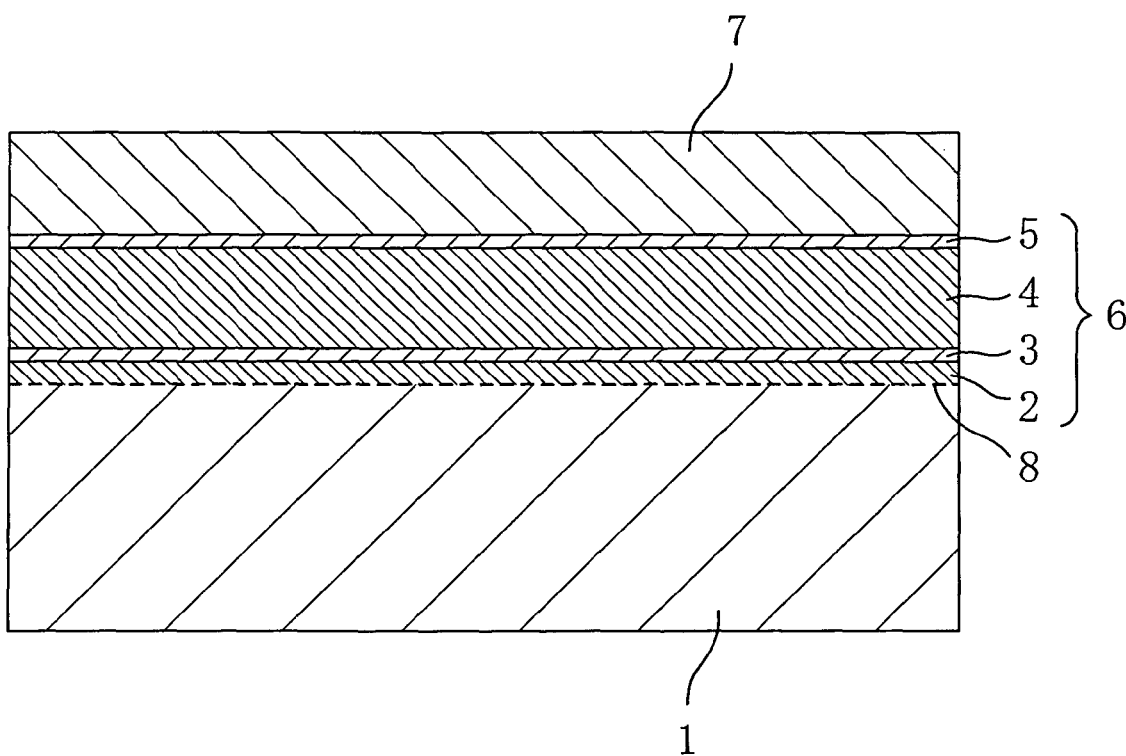
FIG. 1 is a cross-sectional view showing a structure of a portion of a semiconductor device according to a first embodiment including a gate insulating film and its vicinity.

Hereinafter, a structure of a portion including the gate insulating film of a semiconductor device according to a first embodiment and the vicinity thereof will be described with reference to FIG. 1. FIG. 1 is a cross-sectional view showing a structure of the portion including the gate insulating film and its vicinity in the semiconductor device of the first embodiment.

As shown in FIG. 1, in the portion of the inventive semiconductor device including the gate insulating film and the vicinity thereof, a gate insulating film 6 including: a first insulating film 2, which is a thermal oxide film with a thickness of 5 nm; a first cap layer 3, which is an oxynitride film with a thickness of 5 nm; a second insulating film 4, which is an oxide film deposited to a thickness of 130 nm; and a second cap layer 5, which is an oxynitride film with a thickness of 5 nm, is formed on a p-type SiC layer 1. A gate electrode 7 is formed on the gate insulating film 6. A transition layer 8 with a thickness of 1 nm or less is interposed between the SIC layer 1 and the first insulating film 2.

In this embodiment, the gate insulating film 6 includes: the first insulating film obtained by thermal oxidation of SiC; and the second insulating film obtained by deposition by, for example, a CVD process. Hereinafter, the structure of the gate insulating film 6 will be described in detail.

Since the first insulating film 2 is in contact with the SiC layer 1, the first insulating film 2 has a great influence on electric characteristics of a device. The first insulating film 2 is a thermal oxide film obtained by thermally oxidizing an upper part of the SiC layer 1, so that the quality of an interface portion between the SiC layer 1 and the first insulating film 2 (hereinafter, referred to as a SiC-insulating film interface portion) is easily maintained, as compared to a case where an oxide film is deposited by, for example, a CVD process, on the SiC layer 1. The first insulating film 2 preferably has a thickness of 0.5 to 20 nm. Then, the thickness becomes smaller than in a conventional device, so that the SiC-insulating film interface portion is controlled more.

Figure 6:
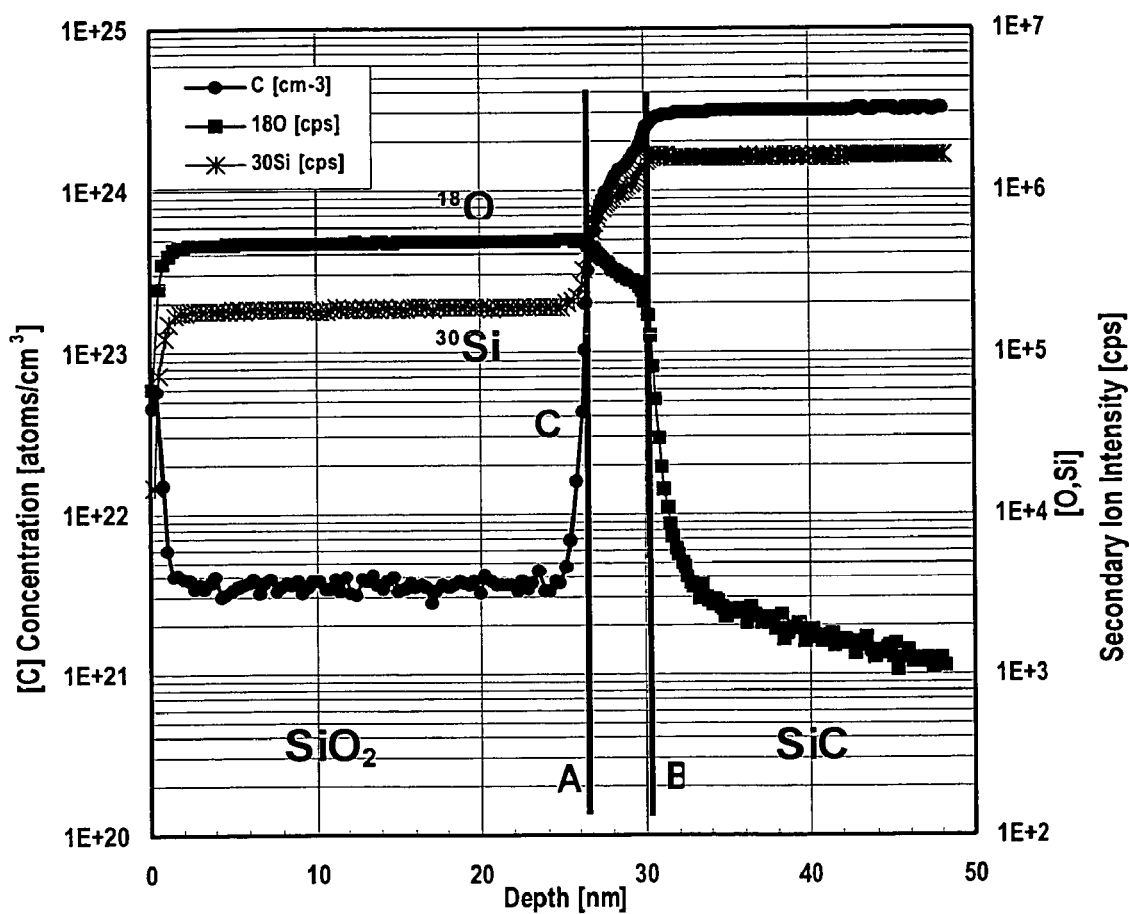
FIG. 6 is a graph showing a result of a SIMS analysis on a sample in which a silicon dioxide film is formed by thermally oxidizing an upper part of SiC.

Now, the transition layer 8 between the SiC layer 1 and the first insulating film 2 will be described with reference to FIGS. 6 and 7. FIG. 6 is a graph showing a result of a SIMS analysis on a sample in which a silicon dioxide film is formed by thermally oxidizing an upper part of SiC. The transition layer is herein a region at the interface between the SiC layer and the oxide film (including a film containing oxygen such as an oxynitride film) in which the content of carbon varies. In other words, in the graph shown in FIG. 6, the transition layer 8 is a region between a falling point A of the $^{18}$O intensity and the maximum point B of the $^{13}$C intensity.

In this region, each of the contents of the three components, Si, O and C, changes continuously. This region includes a large amount of defects causing interface traps.

Figure 7:
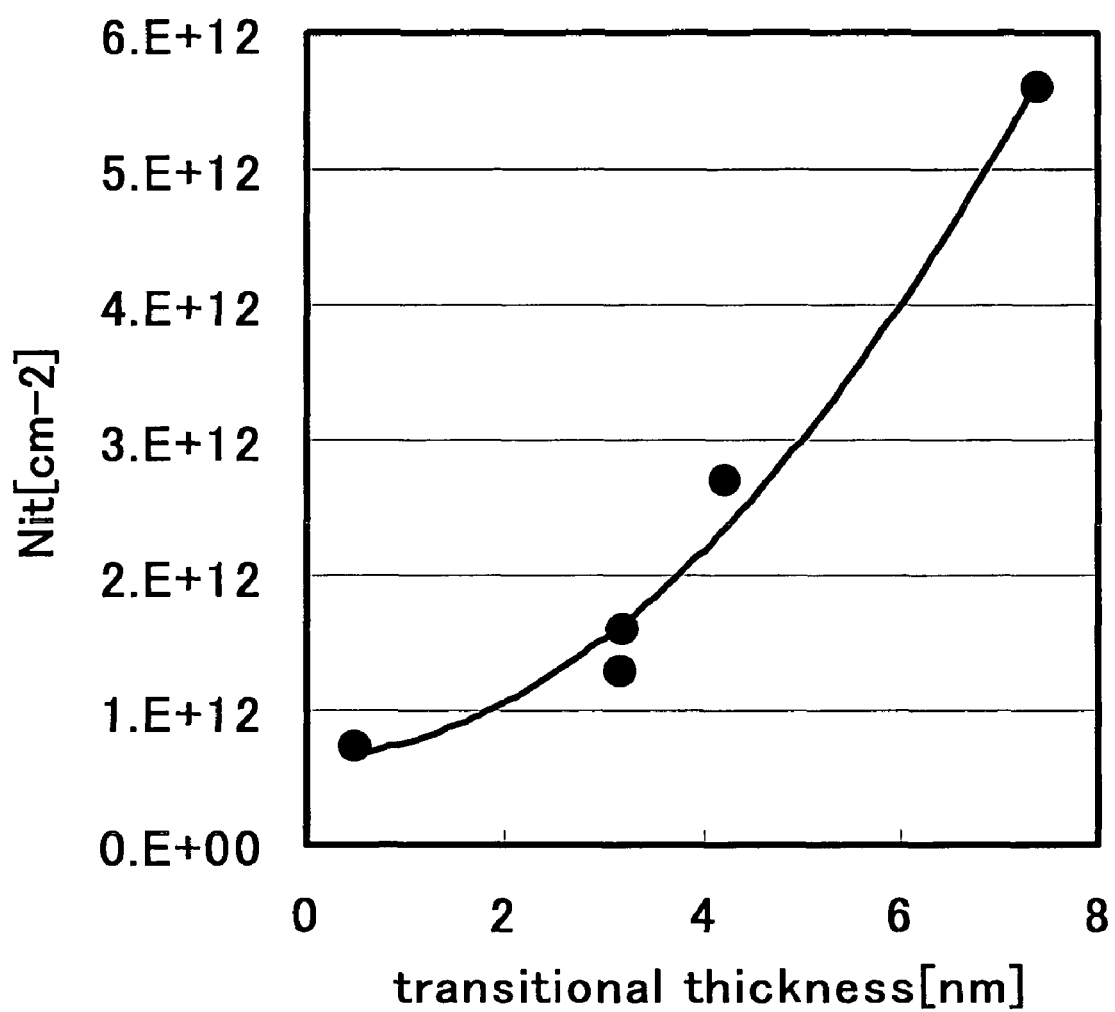
FIG. 7 is a graph showing a correlation between the thickness of a transition layer and the total number of interface traps.

FIG. 7 is a graph showing a correlation between the thickness of the transition layer and the total number of interface traps. In FIG. 7, data for the transition layer thickness of 3 nm or more was obtained by a conventional method. The number of interface traps was calculated by forming an MOS diode using the same oxide film as that used in the measurement in FIG. 6 and performing a CV analysis. The thermal oxide film was formed on a (0001) plane of 4H—SiC.

With the method of this embodiment, the thickness of the transition layer 8 in the SiC-thermal oxide film interface portion is 1 nm or less, and the total trap number is $7\times10^{11}$ cm$^{-2}$. Accordingly, the electric characteristics in the SiC-thermal oxide film interface portion are improved, so that the channel mobility is increased. In this case, the channel mobility has a value of 60 cm$^2$/(V·s).

The oxide film is formed on the 4H—SiC (0001) plane in this embodiment. However, according to the present invention, an oxide film having an excellent SiC-oxide film interface can be formed on other crystal planes.

In this embodiment, the first insulating film 2 is made thin, so that the thickness of the transition layer 8 formed on the SiC substrate 1 is kept small. Accordingly, the number of traps can be reduced.

If a thermal oxide film containing a trace amount (e.g., mole fraction of 0.1% or less) of nitrogen is used as the first insulating film 2, the number of traps can be further reduced.

If the change in composition is sufficiently sharp and discontinuous in the transition layer 8 in the SiC-insulating film interface portion, the band in the transition layer 8 changes continuously. In this case, the thickness of the transition layer 8 is about 0.5 nm. In other words, the distance of transition from the nonconduction region to the conduction region in the SiC-insulating film interface portion is about 0.5 nm or more.

The first cap layer 3 prevents oxygen from diffusing into the first insulating film 2 and the SiC layer 1 in subsequent heat treatment. If the first cap layer 3 is an oxynitride film having a N content of about 10 to 50%, the occurrence of a stress in the oxynitride film is suppressed, so that the defect density is reduced. The first cap layer 3 preferably has a thickness of 0.5 to 10 nm. Then, the function as a cap is exhibited, and in addition, it is possible to suppress the increase of the influence of defects due to an excessive large thickness.

The second insulating film 4 is formed by a CVD process so that the insulating films have a thickness of about 150 nm or more. The second insulating film 4 suppresses the occurrence of leakage current, thus ensuring the reliability of the device. The second insulating film 4 preferably has a thickness of 50 to 200 nm. The second insulating film 4 may be made of an oxynitride film, a nitride film or a high-dielectric-constant material, other than an oxide film. If the second insulating film 4 is made of a high-dielectric-constant material, leakage current is suppressed. In addition, the capacitance of the insulating film increases with high reliability maintained, so that the value of transconductance increases.

The second cap layer 5 is preferably a nitride film with a thickness of 0.5 to 10 nm. Then, it is possible to prevent an impurity from diffusing in a region extending from the gate electrode 7 to the second insulating film 4, during the formation of the gate electrode 7. This impurity is a metal in a case where the gate electrode is made of a metal, and is boron (B) or phosphorus (P) in a case where the gate electrode is made of polysilicon.

Figure 2:
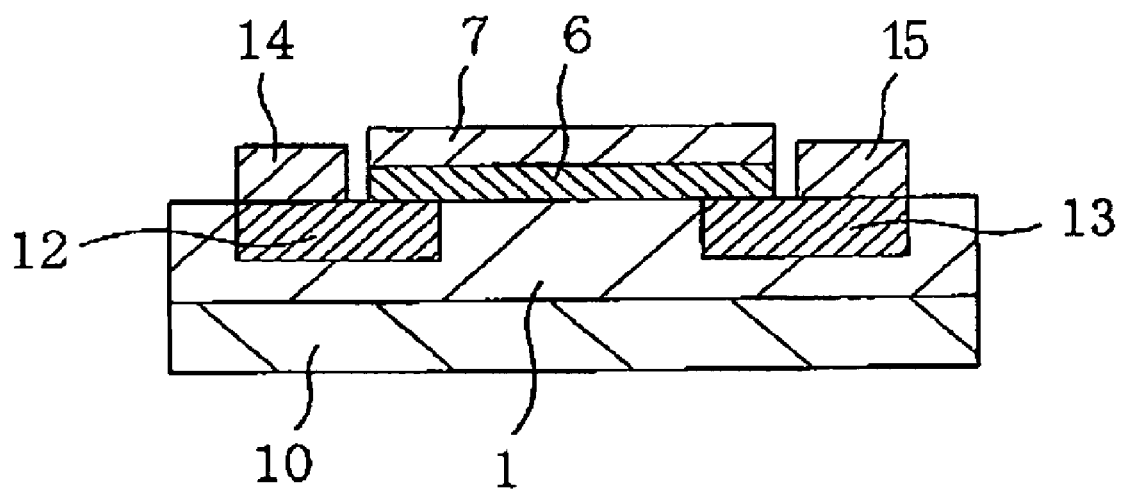
FIG. 2 is a cross-sectional view showing the semiconductor device of the first embodiment.

Now, a structure of the semiconductor device using the gate insulating film 6 as described above will be described with reference to FIG. 2. FIG. 2 is a cross-sectional view showing a structure of the semiconductor device of the first embodiment.

As shown in FIG. 2, the semiconductor device of this embodiment includes: an SiC substrate 10; a p-type SiC layer 1 formed in an upper part of the SiC substrate 10; a gate insulating film 6 formed over the SiC layer 1 with a transition layer (not shown) interposed therebetween; a gate electrode 7 formed on the gate insulating film 6; source and drain regions 12 and 13 respectively formed below the sides of the gate insulating 6 and the gate electrode 7; and source and drain electrodes 14 and 15 formed on the source and drain regions 12 and 13, respectively. The SiC substrate 10 may be either a p-type semiconductor or an n-type semiconductor. A substrate made of an insulator may be used instead of the SiC substrate 10.

Hereinafter, a method for forming the gate insulating film of the semiconductor device of this embodiment will be described with reference to FIG. 3. FIG. 3 is a table showing conditions for a process of forming the gate insulating film of the semiconductor device of the first embodiment.

First, in step ST1, the temperature of the SiC layer 1 is increased to 1300° C. under a reduced-pressure atmosphere with silane introduced. In this case, the temperature may be increased without the introduction of silane because the sublimation rate of SiC is relatively low under a reduced-pressure atmosphere.

Next, in step ST2, oxygen is supplied at $1.4 \times 10^2$ Pa or less onto the SiC layer 1, thereby forming a first insulating film 2 which is a thermal oxide film with a thickness of about 5 nm. In this case, the partial pressure of oxygen is set at $1.4 \times 10^2$ Pa or less, so that the first insulating film can be formed with its thickness controlled sufficiently even at a high temperature of about 1300° C. If the first insulating film 2 is formed by an MBE process, the interface portion is controlled easily, so that atom layers are also controlled easily.

If nitrous oxide at a partial pressure of about 10% or less of that of oxygen is contained in the atmosphere during the thermal oxidation, a first insulating film having a nitrogen content of 10% or less can be formed. In this manner, by having a trace amount of nitrogen contained in the thermal oxide film, it is possible to prevent defects from occurring in the oxide film.

The upper part of the SiC substrate 1 may be exposed to an atmosphere containing an oxidizing gas and silane at a partial pressure of $1.4 \times 10$ Pa or less controlled into a pulse form, using CVD apparatus. In such a case, the first insulating film 2 having an interface portion with sharp change between the SiC substrate 1 and the first insulating film 2 can be formed. In this case, Si can be supplied onto the SiC substrate by introducing silane, so that a thermal oxide film with good quality can be formed without excessively oxidizing the upper part of the SiC substrate 1 during the thermal oxidation.

An UV ozone cleaning process may be performed on the surface of the SiC layer 1 at a temperature of 800 to 1000° C. before the formation of the first insulating film 2.

Then, in step ST3, annealing is performed at a temperature of 1300° C. on the substrate under a carbon monoxide atmosphere or an oxygen atmosphere at $3.9 \times 10^4$ Pa, thus improving the quality of the interface portion.

In this case, the annealing is performed at a temperature of 600 to 1400° C. with carbon monoxide or oxygen at atmospheric pressure or less supplied for three hours or less, thus suppressing the occurrence of defects.

Thereafter, in step ST4, the substrate is placed in CVD apparatus, and silane and ammonia at 66.5 Pa are supplied onto the first insulating film 2 at a temperature of 900° C. for 10 minutes, thereby forming a first cap layer 3 which is a nitride film with a thickness of about 5 nm.

In this case, the temperature is set within the range from 600 to 1000° C. and lower than the temperature for forming the first insulating film shown in step ST2, and the partial pressure of silane is set at $1.4 \times 10^2$ Pa or less. In this manner, the number of defects occurring in the insulating film is reduced to a minimum. In this step, in order to prevent the occurrence of defects, the temperature in the apparatus is not returned to room temperature.

In this step, if nitrous oxide having a flow rate of 10% or less of the total flow rate is added to the silane gas and the ammoniacal gas, an oxynitride film having a nitrogen content of 10 to 30% can be formed.

Then, in step ST5, dichlorosilane and nitrous oxide at $6.65 \times 10$ Pa are supplied onto the first cap layer 3 by a CVD process at a temperature of 800° C. for 30 minutes, thereby forming a second insulating film 4 which is an oxide film deposited to a thickness of about 130 nm. The second insulating film 4 may be made of a material as a combination of $SiO_2$, $Si_3N_4$, $SrTiO_3$, $Al_2O_3$, $Y_2O_3$, $La_2O_3$, $TaO_5$, $TiO_2$, $HfO_2$, and $ZrO_2$, for example, or another material may be contained therein.

If the second insulating film 4 may be formed at a temperature in the range from 600 to 800° C. and lower than the temperature for forming the first cap layer 3 and the annealing temperature, the quality of the insulating films can be maintained.

Subsequently, in step ST6, heat treatment is performed at a temperature of 800° C. in a nitrogen monoxide atmosphere at $3.4 \times 10^4$ Pa for an hour.

Then, in step ST7, silane and ammonia at $1.4 \times 1$ 0 Pa are supplied onto the second insulating film 4 at a temperature of 800° C. for 10 minutes, thereby forming a second cap layer 5 which is a nitride film with a thickness of about 10 nm.

Thereafter, in step ST8, the temperature of the substrate is reduced to room temperature, thereby obtaining a gate insulating film 6 made up of the first insulating film 2, the first cap layer 3, the second insulating film 4 and the second cap layer 5.

Hereinafter, effects obtained in this embodiment will be described.

In the semiconductor device of this embodiment, the gate insulating film 6 includes: the first insulating film 2 with a thickness of 0.5 nm to 20 nm obtained by thermal oxidation of the SiC layer 1; and the second insulating film 4 with a thickness of 5 nm to 200 nm deposited by, for example, a CVD process.

Therefore, the first insulating film 2 has a thickness smaller than that of a conventional thermal oxide film. Accordingly, the interface portion between the SiC layer 1 and the first insulating film 2 is controlled more easily than in a conventional device. Accordingly, the thickness of the transition layer in the interface portion between the SiC layer 1 and the first insulating film 2 can be reduced to 1 nm or less, thus suppressing the occurrence of interface state. In addition, the POA process such as the annealing shown in step ST4 makes it easier to clean carbon remaining in the first insulating film 2 and near the interface portion between the SiC layer 1 and the first insulating film 2 for uniformity in the interface portion.

At the same time, the second insulating film 4 allows the total thickness of the gate insulating film 6 to be about 150 nm or more which is necessary as the thickness of a gate insulating film of a low-loss power semiconductor device.

Embodiment 2

In this embodiment, an example of application of the gate insulating film considered in the first embodiment to an accumulation-type enhancement-mode insulated-gate semiconductor device will be described.

Figure 4:
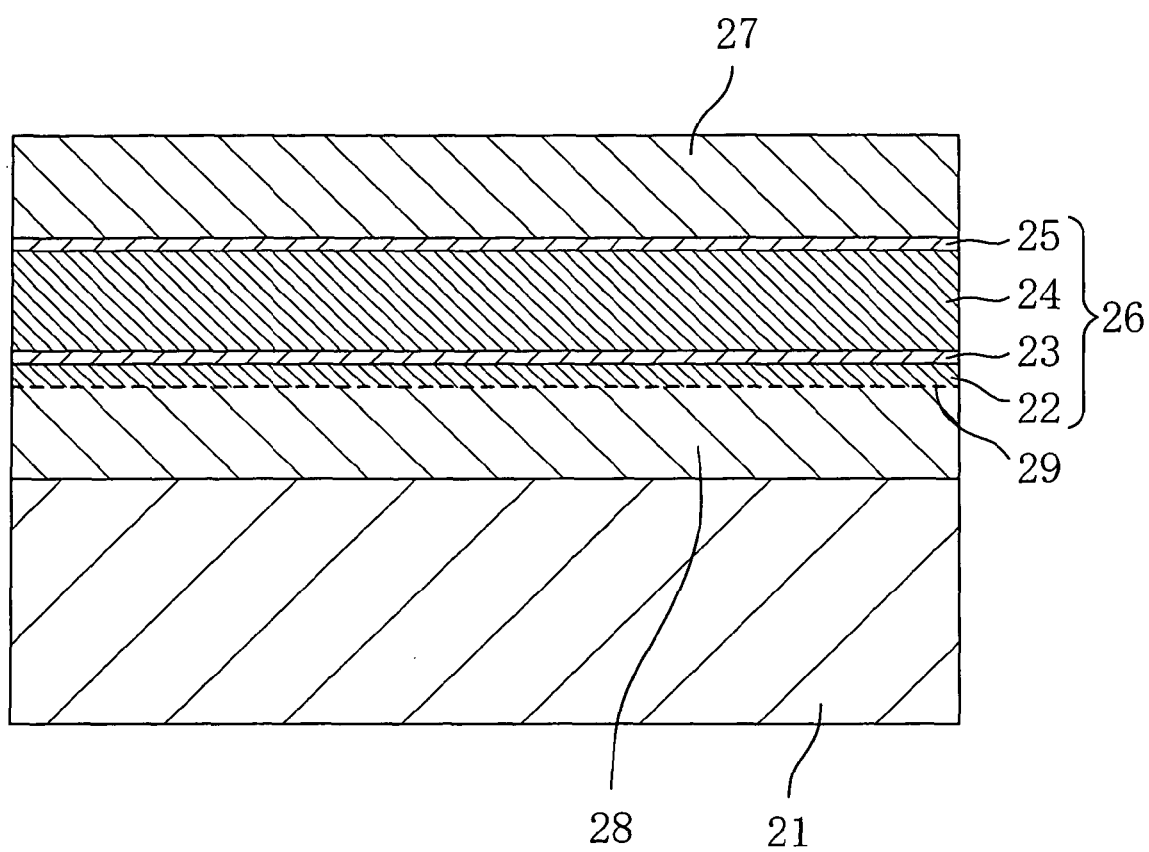
FIG. 4 is a cross-sectional view showing a structure of a portion of a semiconductor device according to a second embodiment including a gate insulating film and its vicinity.

Hereinafter, a structure of a portion of a semiconductor device according to a second embodiment including the gate insulating film and the vicinity thereof will be described with reference to FIG. 4. FIG. 4 is a cross-sectional view showing a structure of the portion including the gate insulating film and its vicinity in the semiconductor device of the second embodiment.

As shown in FIG. 4, in the inventive semiconductor device, an n-channel region 28 is defined in an upper part of an p-type SiC layer 21, a gate insulating film 26 including: a first insulating film 22, which is a thermal oxide film with a thickness of about 5 nm; a first cap layer 23, which is an oxynitride film with a thickness of about 5 nm; a second insulating film 24, which is an oxide film deposited to a thickness of about 130 nm; and a second cap layer 25, which is an oxynitride film with a thickness of about 5 nm, is formed on the n-channel region 28, and a gate electrode 27 is formed on the gate insulating film 26. A transition layer 29 with a thickness of 1 nm or less is interposed between the SiC layer 1 and the first insulating film 2.

Figure 5:
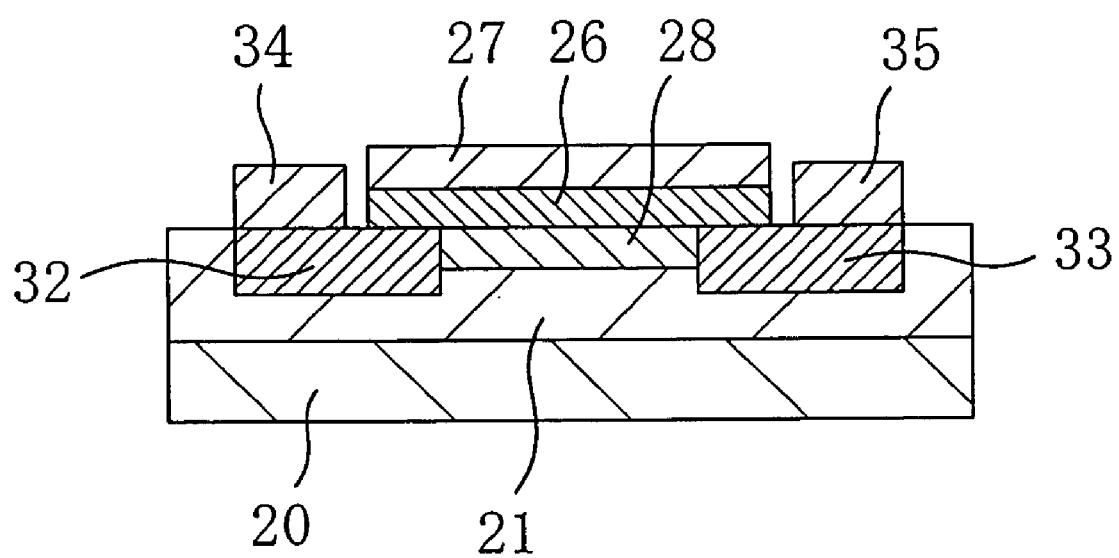
FIG. 5 is a cross-sectional view showing a structure of the semiconductor device of the second embodiment.

Now, a structure of the semiconductor device using the gate insulating film 26 as described above will be described with reference to FIG. 5. FIG. 5 is a cross-sectional view showing a structure of the semiconductor device of the second embodiment.

As shown in FIG. 5, the semiconductor device of this embodiment includes: an n-type SiC substrate 20; the p-type SiC layer 21 formed in an upper part of the SiC substrate 20; an n-channel region 28 defined in an upper part of the SiC layer 21; the gate insulating film 26 formed over the channel region 28 with the transition layer (not shown) interposed therebetween; the gate electrode 27 formed on the gate insulating film 26; source and drain regions 32 and 33 formed in the SiC substrate 20 respectively located below the sides of the gate insulating 26 and the gate electrode 27; and source and drain electrodes 34 and 35 formed on the source and drain regions 32 and 33, respectively.

A method for forming the semiconductor device of this embodiment is the same as that described in the first embodiment except that the n-channel region 28 is formed in the upper part of the p-type SiC layer 21. In this embodiment, the effects obtained by forming the gate insulating film are the same as in the first embodiment.

Embodiment 3

In this embodiment, an example of application of the gate insulating film considered in the first embodiment to an insulated-gate semiconductor device having a δ-doped layer will be described.

This embodiment is characterized in that the gate insulating film described in the first embodiment is formed on the δ-doped layer. The structure of this gate insulating film is the same as in the first embodiment, and thus the description thereof will be herein omitted.

Figure 8:
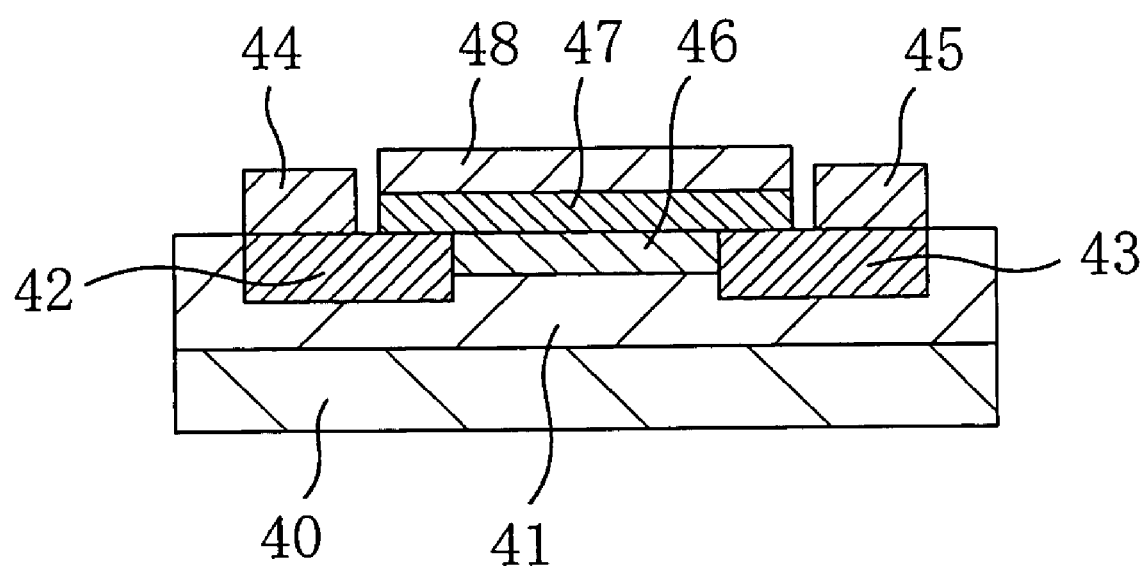
FIG. 8 is a cross-sectional view showing a structure of a semiconductor device according to a third embodiment.

FIG. 8 is a cross-sectional view showing a structure of a semiconductor device according to this third embodiment.

As shown in FIG. 8, the semiconductor device of this embodiment includes: an n-type SiC substrate 40; a p-type SiC layer 41 formed in an upper part of the SiC substrate 40; a channel region 46 defined in an upper part of the p-type SiC layer 41 and having a δ-doped layer; a gate insulating film 47 formed on the channel region 46; a gate electrode 48 formed on the gate insulating film 47; source and drain regions 42 and 43 formed in the SiC layer 41 respectively located below the sides of the gate insulating 47 and the gate electrode 48; and source and drain electrodes 44 and 45 formed on the source and drain regions 42 and 43, respectively.

A method for forming a semiconductor device according to this embodiment is the same as that of the first embodiment except that the channel region 46 having the δ-doped layer is formed in the upper part of the p-type SiC layer 41. In this embodiment, the effects obtained by forming the gate insulating film are the same as in the first embodiment.

Embodiment 4

In this embodiment, an example of application of the gate insulating film considered in the first embodiment to a vertical insulated-gate semiconductor device will be described.

This embodiment is characterized in that the gate insulating film described in the first embodiment is used as a gate insulating film of a vertical MISFET. The structure of this gate insulating film is the same as in the first embodiment, and thus the description thereof will be herein omitted.

Figure 9:
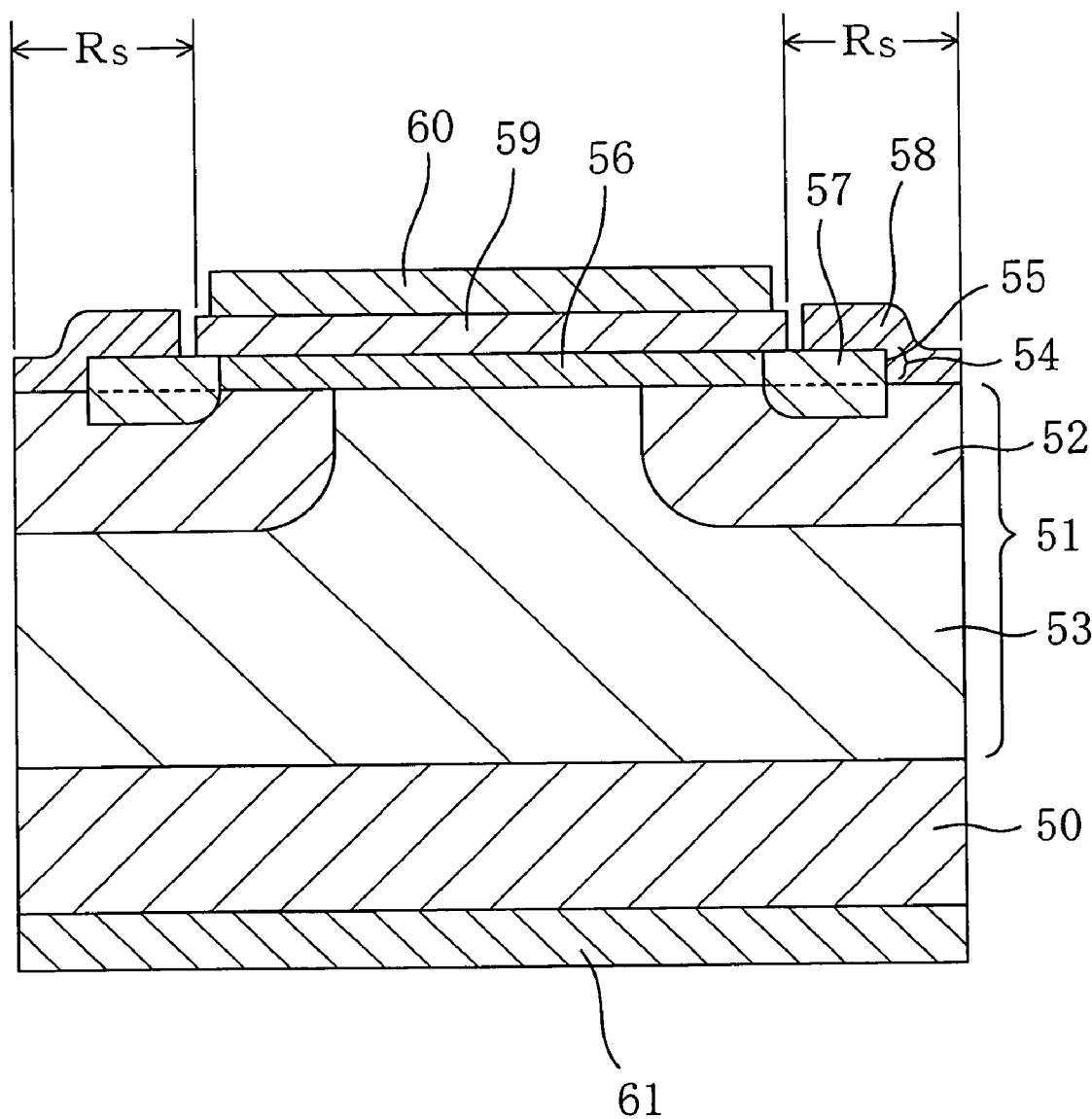
FIG. 9 is a cross-sectional view showing a structure of a semiconductor device according to a fourth embodiment.

FIG. 9 is a cross-sectional view showing a structure of a vertical accumulation-type enhancement-mode MISFET according to this fourth embodiment.

As shown in FIG. 9, in the semiconductor device of this embodiment, a first SiC layer 51 is formed on a SiC substrate 50.

P-well regions 52 containing an impurity of a second conductivity type (p-type) are defined in upper parts of the first SiC layer 51. A drift region 53 containing an impurity of a first conductivity type (n-type) is defined in part of the first SiC layer 51 to surround the p-well regions 52.

A second SiC layer 54 having contact holes (grooves) 55 is provided over part of the first SiC layer 51 including the drift region 53 and the two mutually separated p-well regions 52. An accumulation-type channel layer 56 containing an impurity of the first conductivity type is provided in the second SiC layer 54 except for both ends thereof. A contact region 57 containing an impurity of the first conductivity type is defined in each of the both ends of the second SiC layer 54 to extend to part of the first SiC layer 51 located under the associated end.

A first ohmic electrode (source electrode) 58 is provided on the contact region 57 to extend to the surface of each of the p-well regions 52 exposed at the bottom of the associated one of the contact holes 55.

A gate insulating film 59 is provided on the accumulation-type channel layer 56 in the second SiC layer 54 to cover part of the contact region 57 including the boundary between the contact region 57 and the accumulation-type channel layer 56. The gate insulating film 59 has the same configuration as that in the first embodiment. A gate electrode 60 is provided on the gate insulating film 59.

A second ohmic electrode (drain electrode) 61 is provided on a face (bottom face) of the SiC substrate 50 opposite to the principal surface thereof.

The semiconductor device of this embodiment can be formed by a well-known fabrication method except for the process of forming the gate insulating film 59. The method for forming the gate insulating film 59 is the same as in the first embodiment. In addition, the effects obtained by forming the gate insulating film 59 are the same as in the first embodiment.

In this embodiment, the accumulation-type enhancement-mode transistor is described as an example of a vertical MISFET. However, the present invention is also applicable to inversion-type enhancement-mode transistors.

Embodiment 5

In this embodiment, a case where an oxide film formed by performing dry oxidation on an upper part of a SiC layer and then annealing the part under given conditions is used as a gate insulating film of, for example, an MISFET will be described.

Consideration of Present Inventors

In a case where a thermal oxide film is formed by wet oxidation of a SiC layer, the SiC layer is exposed to an oxygen atmosphere containing water vapor at a high concentration. With a method using wet oxidation, the interface state density is suppressed to $5 \times 10^{11}$ cm$^{-2}$ eV$^{-1}$ or less. However, the resultant thermal oxide film contains hydrogen at a high concentration and has a low density, so that the dielectric breakdown voltage thereof is low. Accordingly, it is considered that the thermal oxide film obtained by wet oxidation lacks reliability.

In addition, in the thermal oxide film obtained by wet oxidation, the density of interface state formed in the vicinity of a conduction band in a band gap cannot be reduced effectively. Accordingly, in a case where a semiconductor device is fabricated by using a thermal oxide film obtained by wet oxidation, it is difficult to increase the mobility dramatically.

On the other hand, in a case where a thermal oxide film is formed by performing dry oxidation on a SiC layer, no water vapor is introduced and the SiC layer is exposed to an oxygen atmosphere having a water vapor partial pressure of 20% or less of the total pressure. The SiC layer is preferably exposed to an atmosphere having a water vapor pressure of 10% or less of the total pressure. The thermal oxide film thus formed has a low concentration of hydrogen and has a high density. Accordingly, the thermal oxide film obtained by dry oxidation has a film property superior to that obtained by wet oxidation. However, in the thermal oxide film obtained by dry oxidation, a high concentration of carbon remains in an interface region between the thermal oxide film and the SiC substrate, so that the interface state density is larger than or equal to $1\times10^{12}$ $cm^{-2}$ $eV^{-1}$.

If the thermal oxide film formed by dry oxidation is oxidized again in a wet atmosphere at a temperature lower than a temperature for dry oxidation, the density of interface state formed in the vicinity of the conduction band in the band gap can be reduced. However, with this method, it is difficult to reduce the interface state density enough to allow the transition layer to have a thickness of 1 nm or less.

As described above, in the case where a thermal oxide film is formed by performing dry oxidation on an upper part of a SiC layer, it is difficult to reduce the thickness of a transition layer at the interface between the thermal oxide film and silicon carbide. However, if the oxide film formed by dry oxidation is dense and has a low defect density, this film is suitable for a gate insulating film.

In view of this, the present inventors invented a method for reducing the thickness of the transition layer by forming an oxide film having an excellent film property through dry oxidation of an upper portion of a SiC layer and then thermally oxidizing the oxide film under given conditions.

Structure of Gate Insulating Film and Example of Application to Device

Hereinafter, a structure of the gate insulating film obtained from the above consideration, and an example of application of the gate insulating film to an insulated-gate semiconductor device will be described.

Figure 10:
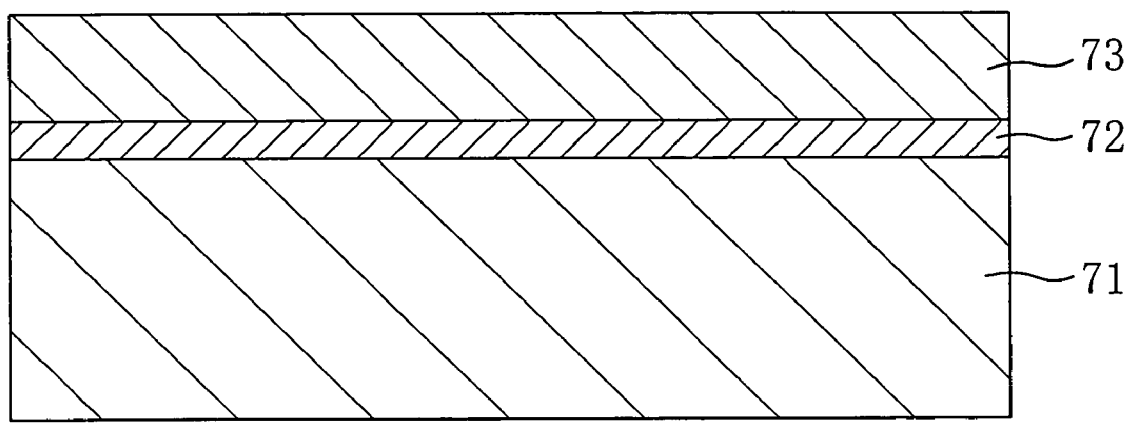
FIG. 10 is a cross-sectional view showing a structure of a portion of a semiconductor device according to a fifth embodiment including a gate insulating film and its vicinity.
Figure 11:
FIG. 11 is a timing chart showing conditions for forming the gate insulating film of the semiconductor device and for performing annealing, in the fifth embodiment.

Hereinafter, a structure of a portion of a semiconductor device according to a fifth embodiment including the gate insulating film and the vicinity thereof will be described with reference to FIGS. 10 and 11. FIG. 10 is a cross-sectional view showing a structure of the portion including the gate insulating film and its vicinity in the semiconductor device of the fifth embodiment. As shown in FIG. 10, a thermal oxide film 73 is formed on a SiC substrate 71 with a transition layer 72 interposed therebetween. FIG. 11 is a timing chart showing conditions for forming the gate insulating film of the semiconductor device and for performing annealing, in the fifth embodiment.

First, as shown in FIG. 11, the SiC substrate 71 (shown in FIG. 10) is placed in an oxygen atmosphere at a temperature of 500° C. with a 4H—SiC (0001) Si-face oriented as the principal surface. Then, the temperature of the SiC substrate 71 is increased to a temperature of 1300° C. and then thermal oxidation (dry oxidation) is performed for two hours. As a result, a thermal oxide film 73 with a thickness of 40 nm serving as a gate insulating film is formed on the 4H—SiC (0001) Si-face of the SiC substrate 71. Then, preannealing is performed under a hydrogen atmosphere at a temperature of 1000° C. for an hour. By performing the preannealing, carbon remaining in the transition layer 72 and its vicinity can be released therefrom. Subsequently, the temperature is decreased to 900° C. with the hydrogen atmosphere maintained.

Thereafter, the substrate is exposed to an atmosphere containing molecules including oxygen at a temperature of 900° C. for three hours, thereby performing annealing.

It is considered that in the atmosphere containing molecules including oxygen, generation of active oxygen allows oxidation of the transition layer 72 so that carbon is released therefrom. The active oxygen is herein oxygen radicals or reactive molecules including oxygen such as nitride monoxide. The oxygen radicals can be generated by irradiating molecules including oxygen such as ozone with UV light or introducing the molecules into plasma.

In this annealing, molecules including nitrogen are supplied in addition to the molecules including oxygen, thereby allowing reduction of thickness of the transition layer 72. It is considered that this is because defects formed in the thermal oxide film due to the release of carbon can be filled with active nitrogen. The active nitrogen is herein nitrogen radicals or reactive molecules including nitrogen such as nitride monoxide. The nitrogen radicals can be generated by irradiating nitrogen molecules or molecules including nitrogen such as ammonia with UV light or introducing the molecules into plasma. The active nitrogen exhibits a nitrogen passivation effect.

By performing the preannealing and the annealing, the transition layer 72 with a thickness of 1 nm or less is formed between the SiC substrate 71 and the thermal oxide film 73 as shown in FIG. 10. The transition layer 72 has a thickness smaller than the conventional film, so that the change in the interface between the SiC substrate 71 and the thermal oxide film 73 becomes sharper.

The thermal oxide film as described above can be used as a gate insulating film of an inversion-type enhancement-mode semiconductor device as shown in FIG. 2, an accumulation-type enhancement-mode semiconductor device as shown in FIG. 5, a semiconductor device using a δ-doped layer as shown in FIG. 8, and a vertical semiconductor device as shown in FIG. 9. The structures of these semiconductor devices except for the gate insulating film are the same as those described in the first through fourth embodiments, and the description thereof is omitted.

If the thermal oxide film of this embodiment is formed on a 4H-SiC (0001) Si-face and is used as a gate insulating film of an inversion-type enhancement-mode insulated-gate silicon-carbide MOSFET, the effective channel mobility is increased to 50 $cm^2/(V\cdot s)$ or more.

As described above, in this embodiment, the thickness of the transition layer can be kept at 1 nm or less. In addition, the concentration of hydrogen contained in the gate insulating film can be lowered, so that the density of the gate insulating film can be increased. Accordingly, a low-loss semiconductor device exhibiting a high breakdown voltage, high reliability, high channel conductance and a low ON resistance can be obtained.

The heat treatment in this embodiment is preferably applied to a thermal oxide film with a thickness of 20 nm or less. In this case, a thermal oxide film with a thickness of 20 nm or less is formed by dry oxidation and then is subjected to given heat treatment, and then an oxide and a nitride are deposited to necessary thicknesses on the thermal oxide film. The gate insulating film thus formed can enhance the reliability and improve the quality.

Embodiment 6

In this embodiment, a case where an oxide film formed by performing dry oxidation on an upper part of a SiC layer and annealing under given conditions is used as a gate insulating film of, for example, an MISFET as in the fifth embodiment will be described.

In this embodiment, preannealing is performed in an atmosphere containing halogen, instead of a hydrogen atmosphere used in the fifth embodiment. This preannealing is performed at a temperature of 1000° C. for 30 minutes. The temperature is decreased to 900° C. with the halogen-containing atmosphere maintained. In an atmosphere containing active halogen, halogen radicals may be generated as active halogen, or a gas containing halogen such as silicon tetrachloride, trichlorosilane and dichlorosilane may be used. By performing the preannealing, carbon remaining in a transition layer 72 and its vicinity can be released therefrom. The other processes are the same as those in the fifth embodiment, and the description and the drawing thereof are herein omitted.

If the thermal oxide film of this embodiment is formed on a 4H—SiC (0001) Si-face and is used as a gate insulating film of an inversion-type enhancement-mode insulated-gate silicon-carbide MOSFET, the effective channel mobility is increased to 50 cm$^2$/(V·S) or more.

The thermal oxide film as described above can be used as a gate insulating film of an inversion-type enhancement-mode semiconductor device as shown in FIG. 2, an accumulation-type enhancement-mode semiconductor device as shown in FIG. 5, a semiconductor device using a δ-doped layer as shown in FIG. 8, and a vertical semiconductor device as shown in FIG. 9. The structures of these semiconductor devices except for the gate insulating film are the same as those described above, and the description of the structure of the semiconductor device and the fabrication method will be herein omitted.

As described above, in this embodiment, the thickness of the transition layer can be kept at 1 nm or less. In addition, the concentration of hydrogen contained in the gate insulating film can be lowered, so that the density of the gate insulating film can be increased. Accordingly, a low-loss semiconductor device exhibiting a high breakdown strength, high reliability, high channel conductance and a low ON resistance can be obtained.

If the thermal oxide film of this embodiment is formed on a 4H-SiC (0001) Si-face and is used as a gate insulating film of an inversion-type enhancement-mode insulated-gate silicon-carbide MOSFET, the effective channel mobility is increased to 50 cm$^2$/(V·s) or more.

The heat treatment in this embodiment is preferably performed on a thermal oxide film with a thickness of 20 nm or less. In this case, a thermal oxide film with a thickness of 20 nm or less is formed by dry oxidation and then is subjected to given heat treatment, and then an oxide and a nitride are deposited to necessary thicknesses on the thermal oxide film. The gate insulating film thus formed can enhance the reliability and improve the quality.

Other Embodiment

An insulated-gate transistor for use as a commercial power device is designed to have various structures for the purpose of withstanding an inverse voltage, or passing rated current with a low ON resistance. Therefore, the insulated-gate transistor of the present invention is not limited to the structures described in the first through sixth embodiments. For example, the present invention is applicable to an insulated-gate transistor having a planar RESURF structure, a vertical insulated-gate transistor and a trench-gate-type insulated-gate transistor. In the case of these transistors, the same effects as those obtained with the gate insulating films of the first through sixth embodiments are also obtained.

The present invention is also applicable to insulated-gate semiconductor devices such as a DMIS, a trench-isolation-type MISFET and an IGBT (insulated-gate bipolar transistor) as well as the semiconductor devices described in the first through sixth embodiments.

In the first through fourth embodiments, the gate insulating film is made up of the first insulating film, the second insulating film, the first cap layer and the second cap layer. However, according to the present invention, it is sufficient that only the first and second insulating films are formed and the first and second cap layers may not be formed. In a case where the second cap layer is not formed, if the second insulating film is an oxynitride film in particular, the second insulating film prevents metal from diffusing during the formation of the gate electrode. Accordingly, the same effects as in the case where the second cap layer is formed are attained.

In the first through fourth embodiments, even if the first insulating film is formed by thermal oxidation in a wet atmosphere, advantages are also obtained.

Even if the second insulating film of the first through fourth embodiments is formed by a plasma CVD process, the same effects as in the first through fourth embodiments are attained.

INDUSTRIAL APPLICABILITY

An inventive semiconductor device and an inventive method for fabricating the device are used as/for a power device incorporated in electronic equipment and, in particular, are applied to devices such as a planar MISFET, a MISFET having a 67 -doped layer or a vertical MISFET and a method for fabricating the devices.

The invention claimed is:

1. A semiconductor device, characterized by comprising:
   a SiC substrate including a source region and a drain region;
   a gate insulating film formed on part of the SiC substrate, said gate insulating film includes a first insulating film formed by oxidizing part of the SiC substrate and a second insulating film deposited over the first insulating film;
   a first cap layer between the first insulating film and the second insulating film; and
   a gate electrode formed on the gate insulating film,
   wherein a transition layer with a thickness of 1 nm or less is formed in an interface region between the SiC substrate and the gate insulating film,
   the first cap layer has a thickness of 0.5 nm to 10 nm, both inclusive,
   the first cap layer is made of an oxynitride film having an N/(N+O) value of 0.1 to 0.5, both inclusive,
   the second insulating film has a thickness of 50 nm to 200 nm, both inclusive, and
   the first insulating film has a thickness of 0.5 nm to 20 nm, both inclusive.

2. The semiconductor device of claim 1, characterized in that the first insulating film is formed by thermally oxidizing part of the SiC substrate.

3. The semiconductor device of claim 1, characterized in that the first insulating film has a nitrogen content of 10.0% or less.

4. The semiconductor device of claim 1, characterized in that the second insulating film is made of one of an oxide, a nitride and an oxynitride.

5. The semiconductor device of claim 1, characterized by including a second cap layer made of a nitride film or an oxynitride film having a thickness of 0.5 nm to 10 nm, both inclusive, between the second insulating fun and the gate electrode.

6. The semiconductor device of claim 1, characterized in that the gate insulating film is formed by performing dry oxidation on part of the SiC substrate, performing preannealing in an atmosphere containing hydrogen, and then performing annealing in an atmosphere containing molecules including oxygen and molecules including nitrogen.

7. The semiconductor device of claim 1, characterized in that the gate insulating film is formed by performing dry oxidation on part of the SiC substrate, performing preannealing in an atmosphere containing halogen, and then performing annealing in an atmosphere containing molecules including oxygen and molecules including nitrogen.

8. The semiconductor device of any one of claims 1, 2, 3, 4 and 5 to 7, characterized in that the semiconductor device is an inversion-type enhancement-mode transistor.

9. The semiconductor device of any one of claims 1, 2, 3, 4 and 5 to 7, characterized in that the semiconductor device is an accumulation-type enhancement-mode transistor.

* * * * *

UNITED STATES PATENT AND TRADEMARK OFFICE
CERTIFICATE OF CORRECTION

| | | |
|---|---|---|
| PATENT NO. | : 7,816,688 B2 | Page 1 of 1 |
| APPLICATION NO. | : 10/494616 | |
| DATED | : October 19, 2010 | |
| INVENTOR(S) | : Kenya Yamashita et al. | |

It is certified that error appears in the above-identified patent and that said Letters Patent is hereby corrected as shown below:

On Page 2 of the patent:

In Item "(56) References Cited", under "FOREIGN PATENT DOCUMENTS", delete "JP 2001-274167".

Signed and Sealed this
Twelfth Day of April, 2011

David J. Kappos
*Director of the United States Patent and Trademark Office*